US008487685B2

(12) United States Patent
Steedman et al.

(10) Patent No.: US 8,487,685 B2
(45) Date of Patent: Jul. 16, 2013

(54) ENHANCED COMPLEMENTARY WAVEFORM GENERATOR

(75) Inventors: Sean Steedman, Phoenix, AZ (US); Hartono Darmawaskita, Chandler, AZ (US); Stephen Bowling, Chandler, AZ (US); Cristian Groza, Bucharest (RO); Ward Brown, Chandler, AZ (US); Zacharias Martin Smit, Chandler, AZ (US)

(73) Assignee: Microchip Technology Incorporated, Chandler, AZ (US)

( * ) Notice: Subject to any disclaimer, the term of this patent is extended or adjusted under 35 U.S.C. 154(b) by 0 days.

(21) Appl. No.: 13/435,642

(22) Filed: Mar. 30, 2012

(65) Prior Publication Data

US 2013/0057330 A1    Mar. 7, 2013

Related U.S. Application Data

(60) Provisional application No. 61/530,599, filed on Sep. 2, 2011.

(51) Int. Cl.
*H03K 3/00* (2006.01)

(52) U.S. Cl.
USPC ............ 327/293; 327/295; 327/259; 327/176

(58) Field of Classification Search
USPC ................. 327/293, 295, 258, 259, 170–176, 327/296, 416, 363; 323/282
See application file for complete search history.

(56) References Cited

U.S. PATENT DOCUMENTS

| | | | | |
|---|---|---|---|---|
| 5,867,046 A * | 2/1999 | Sugasawa | ....................... | 327/258 |
| 6,577,167 B1 * | 6/2003 | Soda | ................................ | 327/91 |
| 7,804,379 B2 * | 9/2010 | Kris et al. | ....................... | 332/109 |

* cited by examiner

*Primary Examiner* — Long Nguyen
*Assistant Examiner* — Thomas Skibinski
(74) *Attorney, Agent, or Firm* — King & Spalding L.L.P.

(57) ABSTRACT

An enhanced complementary waveform generator (ECWG) generates two complementary pulse width modulation (PWM) outputs determined by rising and falling event sources. In a simple configuration of the ECWG, the rising and falling event sources are the same signal which is a PWM signal having the desired period and duty cycle. The ECWG converts this single PWM input into dual complementary PWM outputs. The frequency and duty cycle of the dual PWM outputs substantially match those of the single input PWM signal. Blanking and deadband times may be introduced between the dual complementary PWM outputs, and the dual complementary PWM outputs may also be phase delayed.

22 Claims, 5 Drawing Sheets

ENHANCED COMPLEMENTARY WAVEFORM GENERATOR

RELATED PATENT APPLICATION

This application claims priority to commonly owned U.S. Provisional Patent Application Ser. No. 61/530,599; filed Sep. 2, 2011; entitled "Complementary Waveform Generator," by Sean Steedman, Hartono Darmawaskita, Stephen Bowling, Cristian Groza, Ward Brown and Zacharias Martin Smit; which is hereby incorporated by reference herein for all purposes.

TECHNICAL FIELD

The present disclosure relates to complementary waveform generation and output therefrom, and, more particularly, to an integrated replacement for complementary waveform generator (CWG) and complementary output generator (COG) modules used in power control, e.g., a switch mode power supply (SMPS), battery charger, light emitting diode (LED) and general lighting control applications, etc.

BACKGROUND

Typically complementary waveform generator (CWG) and complementary output generator (COG) modules have been implemented with a number of integrated circuits and/or discrete semiconductor components that are application specific. Also processor based applications implement CWG functions using firmware but require a powerful processor to do so, thus requiring a more expensive integrated circuit processor.

SUMMARY

Therefore what is needed is an integrated solution for CWG and COG functions in a low cost microcontroller that may provide in a digital module, rising and falling input sources that generate two complementary outputs with deadband, blanking and phase shift capabilities, and having inputs that are programmable to be either edge or level sensitive.

According to an embodiment, an apparatus for generating complementary waveforms may comprise: a clock input coupled to a clock source; a rising event input coupled to a rising event source; a rising event blanking circuit having an input coupled to the rising event source, wherein the rising event blanking circuit is used to blank out subsequent rising event signals rising within a programmable rising event blanking time period; rising event combinatorial logic having a first input coupled to the rising event source and a second input coupled to an output of the rising event blanking circuit, wherein when the first and second inputs are at a first logic level an output thereof is at the first logic level; a rising event level detector having an input coupled to an output of the rising event combinatorial logic, wherein the rising event level detector detects a rising change in a voltage level of the output from the rising event combinatorial logic; a rising event phase delay circuit having an input coupled to the output from the rising event level detector, wherein the rising event phase delay circuit has a output that has a programmable delay from its input; a rising event multiplexer having a first input coupled to the output of the rising event combinatorial logic and a second input coupled to an output of the rising event phase delay circuit, wherein when the first input is selected the rising event source is detected on a rising edge thereof and when the second input is selected the rising event source is detected on a rising voltage level thereof; a falling event input coupled to a falling event source; a falling event blanking circuit having an input coupled to the falling event source, wherein the falling event blanking circuit is used to blank out subsequent falling event signals falling within a programmable falling event blanking time period; falling event combinatorial logic having a first input coupled to the falling event source and a second input coupled to an output of the falling event blanking circuit, wherein when the first and second inputs are at a first logic level an output thereof is at the first logic level; a falling event level detector having an input coupled to an output of the falling event combinatorial logic, wherein the falling event level detector detects a falling change in a voltage level of the output from the falling event combinatorial logic; a falling event multiplexer having a first input coupled to the output of the falling event combinatorial logic and a second input coupled to an output of the falling event level detector, wherein when the first input is selected the falling event source is detected on a falling edge thereof and when the second input is selected the falling event source is detected on a falling voltage level thereof; a reset-set (RS) flip-flop having a set input coupled to an output of the rising event multiplexer and reset input coupled to an output of the falling event multiplexer, wherein when the set input goes to the first logic level a Q output of the RS flip-flop goes to the first logic level and when the reset input goes to the first logic level a Q-not output of the RS flip-flop goes to the first logic level and the Q output goes to a second logic level; first output combinatorial logic having a first input coupled to the Q output of the RS flip-flop; a first programmable deadband time circuit having an output coupled to a second input of the first output combinatorial logic and a reset input coupled to the Q output of the RS flip-flop, wherein when the reset input is at the first logic level the output goes to the first logic level after a first programmable deadband time, whereby the output of the first output combinatorial logic goes to the first logic level; second output combinatorial logic having a first input coupled to the Q-not output of the RS flip-flop; and a second programmable deadband time circuit having an output coupled to a second input of the second output combinatorial logic and a reset input coupled to the Q-not output of the RS flip-flop, wherein when the reset input is at the first logic level the output goes to the first logic level after a second programmable deadband time, whereby the output of the second output combinatorial logic goes to the first logic level.

According to a further embodiment, a clock multiplexer is coupled between the clock input and a plurality of clock sources. According to a further embodiment, a rising event multiplexer is coupled between the rising event input and a plurality of rising event sources. According to a further embodiment, a falling event multiplexer is coupled between the falling event input and a plurality of falling event sources. According to a further embodiment, output polarity reversing circuits are included in the first output combinatorial logic and the second output combinatorial logic.

According to a further embodiment, a first output multiplexer having a first input coupled to an output of the first output combinatorial logic and a second input coupled to a first programmable logic level is provided; and a second output multiplexer having a first input is coupled to an output of the second output combinatorial logic and a second input coupled to a second programmable logic level; wherein when an auto-shutdown occurs outputs of the first and second multiplexers are forced to the first and second logic levels, respectively.

According to a further embodiment, first and second disconnect switches are coupled to the first and second outputs of the first and second output multiplexers, respectively, for disconnecting the first and second outputs from first and second inputs of power circuits. According to a further embodiment, the apparatus for generating complementary waveforms is included in an integrated circuit that also comprises a pulse width modulation (PWM) generator having an output coupled to the rising and falling event inputs. According to a further embodiment, the auto-shutdown has at least one auto-shutdown input.

According to a further embodiment, outputs of the first and second output combinational logics are never at the first logic level at the same time. According to a further embodiment, outputs of the first and second output combinational logics are at the second logic levels during either the first and/or second programmable deadband times. According to a further embodiment, the rising and falling event blanking circuits, the rising event phase delay circuit, and the first and second programmable deadband time circuits are coupled to the clock input and derive incremental time values therefrom. According to a further embodiment, rising and falling blanking time registers for storing the rising and falling event blanking time periods are provided; a rising event phase delay register for storing a rising event phase delay time; and rising and falling deadband time registers for storing rising and falling event deadband time values.

According to another embodiment, a method for generating complementary waveforms may comprise the steps of: providing a rising event source; providing for blanking of subsequent rising events within a programmable rising event blanking time period; selecting between detection of a rising event source edge or a rising event source voltage level for generating a rising event signal; providing a falling event source; providing for blanking of subsequent falling events within a programmable falling event blanking time period; selecting between detection of a falling event source edge or a falling event source voltage level for generating a falling event signal; asserting a first output upon detection of the rising event until detection of the falling event; and asserting a second output upon detection of the falling event until detection of a next rising event.

According to a further embodiment of the method, a step a rising event phase delay is provided, wherein the rising event phase delay delays the rising event signal. According to a further embodiment of the method, a step of providing a deadband time between the steps of asserting the first output and asserting the second output is provided. According to a further embodiment of the method, the step of providing the deadband time comprises the step of delaying assertion of the first output after the step of de-asserting the second output. According to a further embodiment of the method, the step of providing the deadband time comprises the step of delaying assertion of the second output after the step of de-asserting the first output.

According to a further embodiment of the method, a step of forcing the first and second outputs to predefined logic levels upon assertion of an auto-shutdown is provided. According to a further embodiment of the method, the steps of: selecting the rising event source from a plurality of rising event sources; and selecting the falling event source from a plurality of falling event sources are provided. According to a further embodiment of the method, the steps of enabling and disabling the first and second outputs are provided. According to a further embodiment of the method, the steps of: storing rising and falling event blanking time period values in rising and falling blanking time period registers; storing rising event phase delay in a rising event phase delay register; and storing rising and falling event deadband time period values in rising and falling deadband time period registers are provided.

BRIEF DESCRIPTION OF THE DRAWINGS

A more complete understanding of the present disclosure may be acquired by referring to the following description taken in conjunction with the accompanying drawings wherein.

Figure 1:
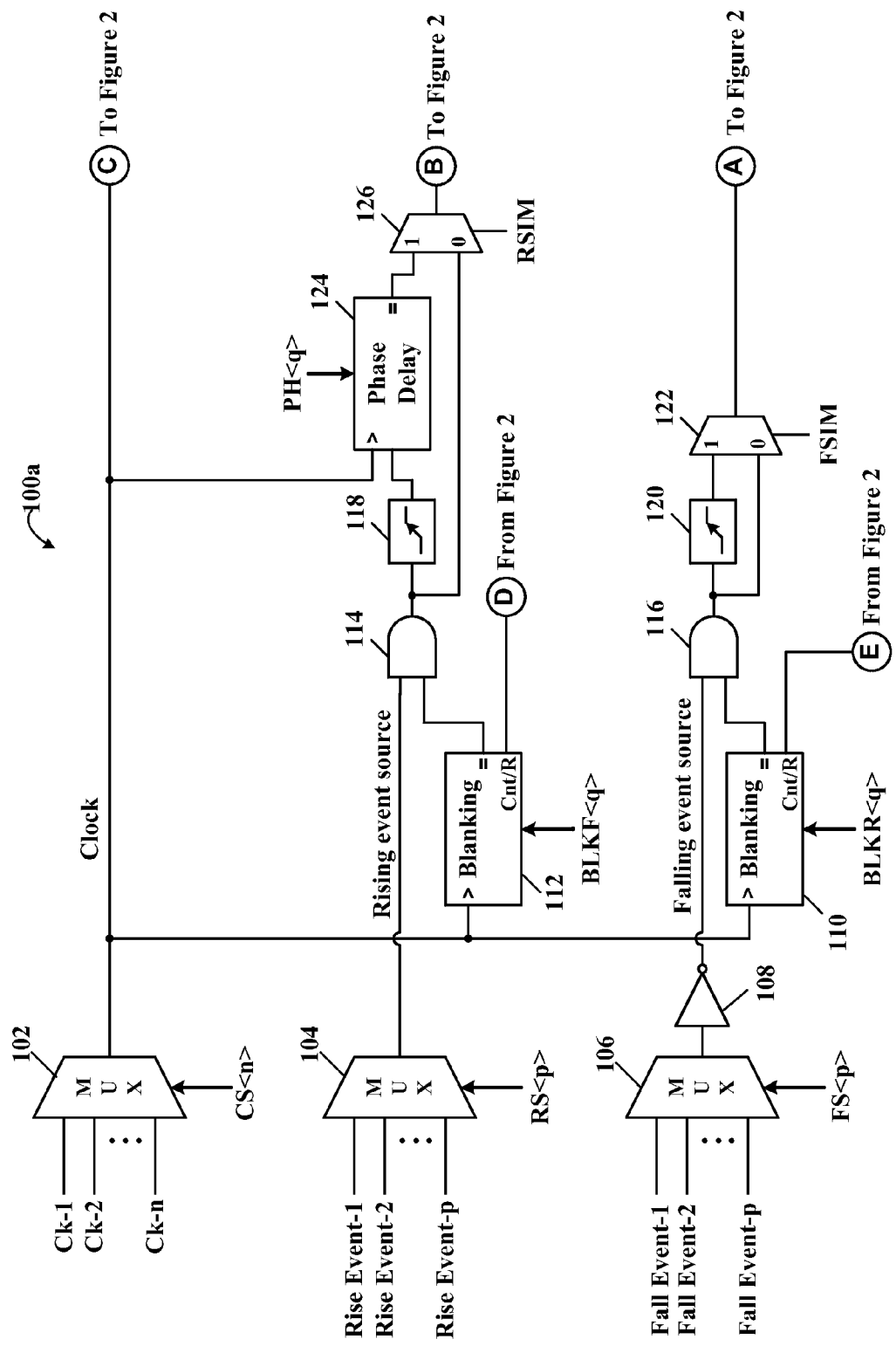
FIGS. 1 and 2 illustrate a schematic block diagram of an enhanced complementary waveform generator, according to a specific example embodiment of this disclosure.

While the present disclosure is susceptible to various modifications and alternative forms, specific example embodiments thereof have been shown in the drawings and are herein described in detail. It should be understood, however, that the description herein of specific example embodiments is not intended to limit the disclosure to the particular forms disclosed herein, but on the contrary, this disclosure is to cover all modifications and equivalents as defined by the appended claims.

DETAILED DESCRIPTION

An enhanced complementary waveform generator (ECWG) generates two complementary pulse width modulation (PWM) outputs determined by rising and falling event sources, according to the teachings of this disclosure. In a simple configuration of the ECWG, the rising and falling event sources are the same signal, which is a PWM signal having the desired period and duty cycle. The ECWG converts this single PWM input into dual complementary PWM outputs. The frequency and duty cycle of the dual PWM outputs substantially match those of the single input PWM signal. Other and further configurations will be readily apparent to one having ordinary skill in the art of digital design and having the benefit of this disclosure.

Referring now to the drawings, the details of a specific example embodiment is schematically illustrated. Like elements in the drawings will be represented by like numbers, and similar elements will be represented by like numbers with a different lower case letter suffix.

Figure 2:
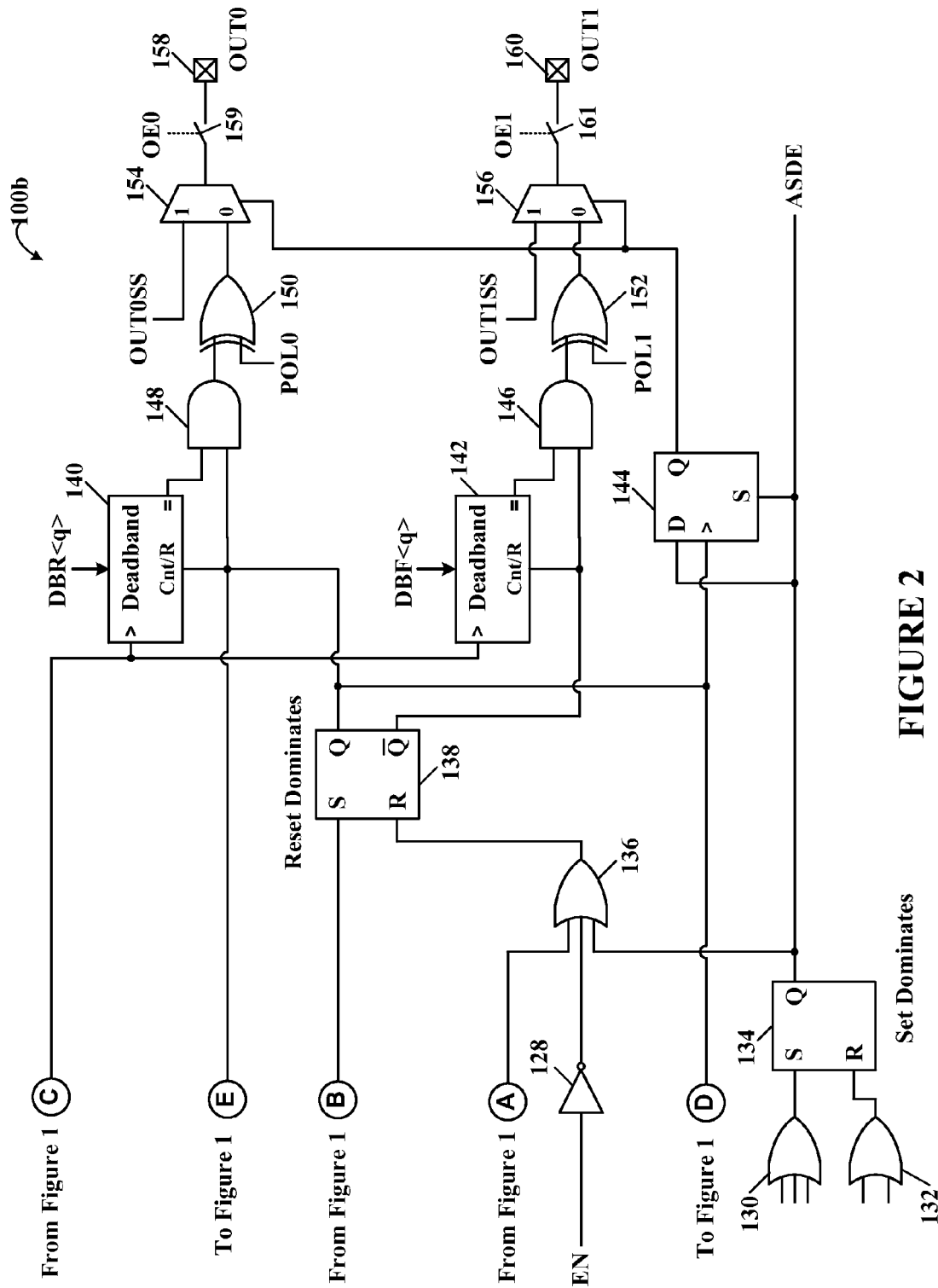

Referring to FIGS. 1 and 2, depicted is a schematic block diagram of an enhanced complementary waveform generator, according to a specific example embodiment of this disclosure. The enhanced complementary waveform generator is generally represented by the numeral 100 (FIG. 1-100a and FIG. 2-100b). A clock source is selected with a multiplexer 102. The multiplexer 102 may be controlled from a clock source register (not shown) having an output CS<n>, where n is a binary value. The selected clock source is used for blanking counters 110 and 112, a phase delay counter 124, and dead band counters 140 and 142. A rising event source is selected with a multiplexer 104. The multiplexer 104 may be controlled from a rising source register (not shown) having an output RS<p>, where p is a binary value. A falling event source is selected with a multiplexer 106. The multiplexer 106 may be controlled from a falling source register (not shown) having an output FS<p>, where p is a binary value.

The rising and falling events may be from the same source, e.g., a single output from a PWM generator. This source(s) may be synchronous or asynchronous to the selected clock source. The rate at which the rising event occurs determines the PWM frequency. The time from the rising event input to the falling event input determines the duty cycle thereof. The selected clock source is used to generate the phase delay, blanking and dead-band times.

Edge and Level Sensing of Event Sources

The rising and/or the falling event sources may be selected as level or edge detection sensitive. For a level detection of rising event, the selected rising event source passes through AND gate 114 whose output is coupled to level detector 118 and an input of multiplexer 126. The output of the level detector 118 is coupled to an input of the phase delay counter 124, and an output of the phase delay counter 124 is coupled to another input of the multiplexer 126. The phase delay counter 124 can introduce a delay (phase) to the selected rising event according to a value from a phase delay register (not shown) having an output PH<q>, where q is a binary value. When q is zero (0) there is no phase delay applied to the selected rising event. For event detection of a rising edge, the input of the multiplexer 126 is selected by a control input, RSIM, of 0. The level detection of the rising event is selected when the multiplexer 126 has a selection control input, RSIM, of logic 1, or visa versa.

The selected falling event source passes through inverter 108 and AND gate 116. The output of the AND gate 116 is coupled to level detector 120 and an input of multiplexer 122. The output of the level detector 120 is coupled to another input of the multiplexer 122. Detection of the falling edge of the event is selected when the multiplexer 122 has a selection control input, FSIM, of logic 0, and level detection of the falling event is selected when the multiplexer 122 has a control input, FSIM, of logic 1.

Edge Versus Level Sensing

In general, events that are driven from a periodic source should be edge detected and events that are derived from voltage thresholds at a target circuit, e.g., switch mode power supply (SMPS), should be level sensitive. Consider the following two examples: The first example is an application in which the period is determined by a 50% duty cycle clock and the ECWG output duty cycle is determined by a voltage level fed back through a comparator. If the clock input is level sensitive then duty cycles less than 50% may exhibit erratic operation. The second example is similar to the first except that the duty cycle is close to 100%. The feedback comparator (e.g., of the SMPS) high-to-low transition trips the ECWG drive off but almost immediately the period source turns the drive back on. If the off cycle is short enough then the comparator input may not reach the low side of the hysteresis band, precluding an output change. The comparator output stays low and without a high-to-low transition to trigger the edge sense then the drive of the ECWG output will be stuck in a constant drive-on condition.

Rising Event

The rising event starts the PWM output active duty cycle period. The rising event is the low-to-high transition of the selected rising event source. When the phase delay and rising event dead-band time values are zero, the output 158, OUT0, starts immediately. Otherwise, the output 158, OUT0, is delayed. The rising event causes all of the following actions: Start rising event phase delay counter 124 (if enabled). Clear output 160, OUT1, after the phase delay counter 124 expires (has timed out). Start falling event input blanking counter 110 (if enabled). Start dead-band counter 140 (if enabled). Set output, OUT0, after the dead-band counter 140 expires (has timed out).

The output from the multiplexer 126 is coupled to a set input of the R-S flip-flop 138. The output from the multiplexer 122 is coupled to an input of OR gate 136. An output from the OR gate 136 is coupled to a reset input of the R-S flip-flop 138. The reset input of the R-S flip-flop 138 dominates over the set input thereof. A rising event will cause a set condition in the R-S flip-flop 138 wherein the Q-output thereof goes to a logic 1 (high) and the Q\not-output thereof goes to a logic 0 (low). When the Q-output of the R-S flip-flop 138 is at a logic 1, the rising source dead band counter 140 and the falling event blanking counter 110 are both enabled and operate if there are non-zero timing value inputs DBR<q> and BLKR<q>, respectively, otherwise no rising event dead band and/or falling event blanking occur.

When both inputs of the AND gate 148 are at logic 1, a logic 1 will be asserted at the output thereof. The XOR gate 150 is used to select a normal or inverted polarity output of the AND gate 148 and applies it to an output selection multiplexer 154. The output selection multiplexer 154 may be used to force a predefined output value for output 158, OUT0, when a shutdown occurs, as more fully described hereinafter. During non-shutdown, normal operation the output 158, OUT0, is the output from the XOR gate 150. A disconnect switch 159 may be used to disconnect (float) the integrated circuit (not shown) output 158 from the output of the multiplexer 154.

Falling Event

The falling event terminates the PWM output active duty cycle period. The falling event is the high-to-low transition of the selected falling event source. When the falling event dead-band counter value is zero, the output 160, OUT1, starts immediately. Otherwise, the output 160, OUT1, is delayed. The falling event causes all of the following actions: Clear output 158, OUT0, start rising event input blanking counter 112 (if enabled), start falling event dead-band counter 142 (if enabled), and set output 160, OUT1, after the dead-band counter 142 expires (has timed out).

A falling event will cause a reset condition in the R-S flip-flop 138 wherein the Q\not-output thereof goes to a logic 1 (high) and the Q-output thereof goes to a logic 0 (low). When the Q\not-output of the R-S flip-flop 138 is at a logic 1, the falling source dead band counter 142 is enabled and operates if there is a non-zero timing value input DBF<q>, otherwise no falling event dead band time occurs.

When both inputs of the AND gate 146 are at logic 1, a logic 1 will be asserted at the output thereof. The XOR gate 152 is used to select a normal or inverted polarity output of the AND gate 146 and applies it to an output selection multiplexer 156. The output selection multiplexer 156 may be used to force a predefined output value for output 160, OUT1, when a shutdown occurs, as more fully described hereinafter. During non-shutdown, normal operation the output 160, OUT1, is the output from the XOR gate 152. A disconnect switch 161 may be used to disconnect (float) the integrated circuit (not shown) output 160 from the output of the multiplexer 156.

Blanking Control

Input blanking is a function whereby the event inputs can be masked or blanked for a short period of time. This is to prevent electrical transients caused by the turn-on/off of power components from generating a false input event. The ECWG contains two blanking counters 110 and 112. The blanking counters 110 and 112 are cross coupled with the events they are blanking The falling event blanking counter 112 is used to blank rising input events and the rising event blanking counter 110 is used to blank falling input events. Once started, blanking extends for the time specified by the corresponding blanking register (not shown) outputs BLKF<q> and BLKR<q>. Blanking is timed by counting clock periods from zero up to the value in the respective blanking register.

Rising Event Input Blanking

The falling event blanking counter 112 inhibits the rising event input from triggering a rising event. The falling event blanking time starts when the falling event output drive goes true (output of AND gate 146). The falling event blanking time is set by the value contained in the blanking register (not shown) outputs BLKF<q>, where q is a binary number. When the BLKF<q> value is zero, falling event blanking is disabled and the output of the blanking counter 112 is a logic 1, thereby, allowing a rising event signal to pass straight through to the rising event trigger circuit, e.g., AND gate 114, level detector 118, etc.

Falling Event Input Blanking

The rising event blanking counter 110 inhibits the falling event input from triggering a falling event. The rising event blanking time starts when the rising event output drive goes true (output of AND gate 148). The rising event blanking time is set by the value contained in the blanking register (not shown) outputs BLKR<q>, where q is a binary number. When the BLKR<q> value is zero, rising event blanking is disabled and the output of the blanking counter 110 is a logic 1, thereby, allowing the falling event signal to pass straight through to the falling event trigger circuit, e.g., AND gate 116, level detector 120, etc.

Phase Delay

The phase delay counter 124 may be used to delay assertion of a rising event. The phase delay time is set by the value contained in the rising phase delay register (not shown) outputs PH<q>, where q is a binary number. The delay from the input rising event signal switching to the actual assertion of the events is calculated the same as the dead-band and blanking delays. When the PH<q> value is zero, rising event phase delay is disabled and the output of the phase delay counter 124 is a logic 1, thereby allowing the rising event signal to pass straight through to the multiplexer 126 and RS flip-flop 138.

Dead-Band Control

The dead-band control provides for non-overlapping PWM output signals to prevent shoot through current in the external power switches. There are two dead-band counters 140 and 142. Dead-band counter 140 is used for rising event dead-band control, and dead-band counter 142 is used for falling event dead-band control. Dead-band is timed for each of these counters by counting the number of clock periods from zero up to the values in the respective dead-band count registers (not shown) having outputs DBR<q> and DBF<q>, respectively.

Rising Event Dead-Band

Rising event dead-band delays the turn-on of output 158, OUT0, from when the output 160, OUT1, is turned off. The rising event dead-band time starts when the rising event output goes to a logic 1 (true). The rising event signal into the dead-band counter 140 may be delayed by the phase delay introduced by the phase delay counter 124. When the phase delay time is zero, the rising event output goes true coincident with the unblanked rising input event. When the phase delay time is not zero, the rising event output goes true at the completion of the phase delay time. The rising event dead-band time is set by the value of the output DBR<q>, where q is a binary number, contained in a rising event dead-band time register (not shown). When the value of DBR<q> is zero, rising event dead band is disabled.

Falling Event Dead Band

Falling event dead-band delays the turn-on of output 160, OUT1, from when the output 158, OUT0, is turned off. The falling event dead-band time starts when the falling event output goes to a logic 1 (true). The falling event output goes true coincident with the unblanked falling input event. The falling event dead-band time is set by the value of the output DBF<q>, where q is a binary number, contained in a falling event dead-band time register (not shown). When the value of DBF<q> is zero, falling event dead band is disabled.

Dead-Band Jitter

The rising and falling edge events that trigger the deadband counters 140 and 143 may be from analog inputs, and therefore unsynchronized, there may be some jitter in the actual deadband in each cycle. The maximum jitter is equal to one clock period.

Dead-Band Overlap

There are two types of deadband overlap, rising-event to falling-event and falling-event to rising-event, and each one is treated differently depending upon system requirements.

Rising-Event to Falling-Event Overlap

In this case, the falling event occurs while the rising event deadband counter 140 is still counting. The following sequence of events occur: the rising event deadband counter 140 is counting up but as not yet completed, the falling event deadband counter 142 counting is initiated (valid falling event signal), output waveform control is immediately handed to falling event signals, the rising event deadband counter 140 resets on next clock edge, the falling event deadband counter 142 continues counting until its count is complete, and then the falling event deadband counter 142 resets on the next clock edge (normal operation).

Falling Event to Rising Event Overlap

Falling event dead-band delays the turn-on of output 160, OUT1, from when the output 158, OUT0, is turned off. The falling event dead-band time starts when the falling event output goes true. The falling event output goes true coincident with the unblanked falling input event. The falling event dead-band time is set by the value of the output DBF<q>, where q is a binary number, contained in a falling event dead-band time register (not shown). When the value of DBF<q> is zero, falling event dead band is disabled.

Output Control

Output Enables

Each ECWG output 158, OUT0, and output 160, OUT1, has individual output enable control, e.g., switches 159 and 161, respectively. The output enables (e.g., switches 159 and 161) are independent of the module enable bit. If either or both of the ECWG output 158 and/or 160 are disabled, the module asserts no control over that output. However, any internal connections made with the module output signals are still active. If ECWG output 158 and/or 160 are enabled, then the active PWM waveform is applied to that output, per the port priority selection. Internal signal connections are still active.

Output enables may be selected with OE0 and OE1 bits from an output enable register (not shown). When an output enable control is cleared, the module asserts no control over the pin. When an output enable is set, the override value or active PWM waveform is applied to the pin per the port priority selection. The output enables are independent of any other module enable bit.

Output Polarity Control

The polarity of each output 158 and 160 can be selected independently. When an output polarity bit is set, e.g., POL0 and/or POL1, the corresponding output 158 and 160 is active low. Clearing the output polarity bit configures the corresponding output 158 and 160 as active high. However, polarity does not affect the override levels. Output polarity may be selected with POL0 and POL1 bits from a polarity control register (not shown).

Auto-Shutdown Control

Auto-shutdown may be used to immediately override the current input values with specific overrides that allow for safe shutdown of the circuit. Restart may also be used under certain conditions.

Shutdown

There are two ways to generate a shutdown event: manual override or an external input source.

Manual Override

The auto-shutdown registers can used to manually override the pin functions if required. By setting an ASDE bit, a shutdown event is generated. The ASDE bit may be settable even if the module is disabled. This will allow the ASD override states (OUT0SS and OUT1SS) to be placed on the outputs 158 and 160, respectively, even if the module is disabled. Multiplexers 154 and 156 are shown to perform this function, but one having ordinary skill in digital circuit design and the benefit of this disclosure could design other equally effective circuits, and those circuits are contemplated herein. If auto-restart is disabled, this override will persist as long as the control bit is set in the auto-shutdown control register (not shown). If auto-restart is enabled, the bit will automatically self-clear and resume operation on the next rising edge event.

External Input Source

Any of the given sources that are available for event generation are available for system shut-down. This is so that external circuitry can monitor and force a shutdown without any software overhead. Note: There are two important considerations for the auto-shutdown (ASD) sources. 1) ASD are level sensitive, not edge sensitive, and as long as the ASD level persists, the ASD event is in progress. 2) ASD inputs are active low signals, e.g., inputs to the ECWG module need to drive logic '0' to generate a shutdown event.

Restart

After an auto-shutdown event has occurred, there are two ways to have the ECWG module resume operation:

Manual Restart

Restart on the next rising edge event once the auto-shutdown source has gone inactive and then after the ASDE bit from flip-flop 134 has been cleared in software.

Auto-Restart

Automatically restart on the next rising edge event once the auto-shutdown event signal has been cleared. Note: the ASDE bit cannot be cleared in software if the auto-shutdown condition is still present on at least one of the inputs to OR gate 130.

Output Drive

The multiplexers 154 and 156 will maintain overrides OUT0SS and OUT01SS, respectively, until there is a valid rising event to indicate that normal operation should resume, thereby clearing flip-flop 144. The rising event may have edge or level dependencies depending on how it is configured.

Buffer Updates

The buffers for deadband, phase and blanking need to be loaded with the corresponding register value at different times during module operation. These times can be when the ECWG module is disabled or enabled.

ECWG Module Disabled

When the ECWG module is disabled, a write to the deadband, phase and blanking registers will also directly load the respective buffers as well.

ECWG Module Enabled

When the module is enabled, it is necessary to ensure that when values are changed, that all buffers update in the same period. An example is when a device is running at a low clock speed (e.g., 1 MHz) with a fast period coming into the ECWG module (e.g., 500 kHz). Under this circumstance, it would require several clock periods to update the deadband, phase delay and blanking values with new values. This updating across multiple periods is not desired and so a way to synchronize the buffer update must be used. The steps for loading the buffers are as follows:

1. Update all register values
2. Set a load bit
3. On next rising edge of the falling event signal, latch the falling event signal:
    a) close latch for the falling event signal
    b) load the rising event dead band buffer
    c) load the falling event blanking buffer
    d) load the phase delay buffer
    e) open the latch for the falling event signal
4. On next rising edge of the rising event, load:
    a) close latch for the falling event signal (the falling event signal generates the rising event signal, so latching falling event will prevent changes in the rising event)
    b) load the dead band falling event register
    c) load the dead band rising event register
    d) Clear the load bit to indicate load complete.
    e) Open the falling event latch.

The load bit can not be cleared in software, it is only settable in software and cleared in hardware. This is to prevent unintended operation during the loading procedure.

Figure 3:
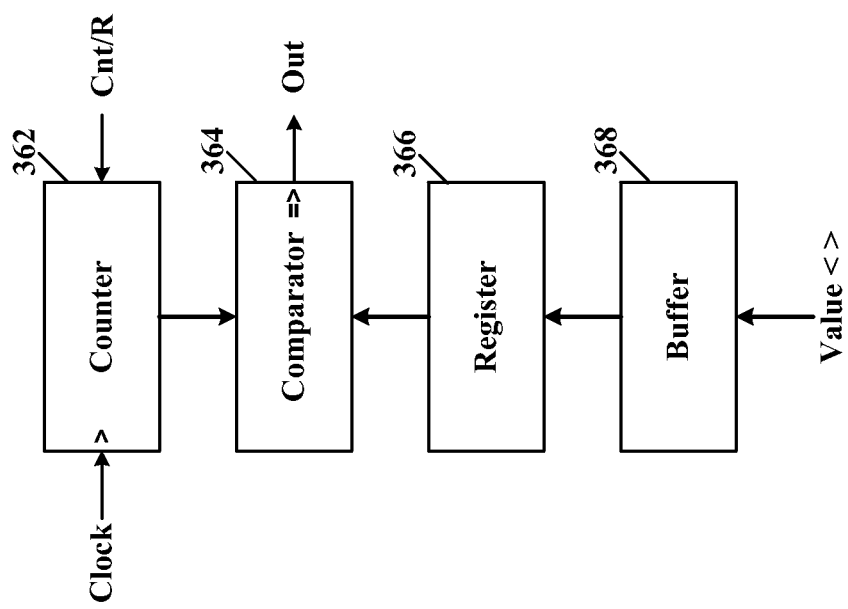
FIG. 3 illustrates a more detailed schematic block diagram of the blanking, phase delay and deadband counter, register and buffer circuits shown in FIGS. 1 and 2.

Referring to FIG. 3, depicted is a more detailed schematic block diagram of typical blanking, phase delay and deadband counter, register and buffer circuits shown in FIGS. 1 and 2. Each of the blanking, phase delay and deadband counters 110, 112, 124, 140 and 142 comprise a counter 364 that counts each clock pulse and outputs its counts to a comparators 364. The comparator 364 compares the count value to a time value, e.g., blanking, phase delay and deadband times are stored in respective registers 366. When the count value is equal to or greater than the time value, an output, OUT, from the comparator goes to a logic 1. Respective buffers 368 are used to asynchronously store the time values for blanking, phase delay and deadband times for subsequent synchronous transfer to the respective registers 366.

Figure 4:
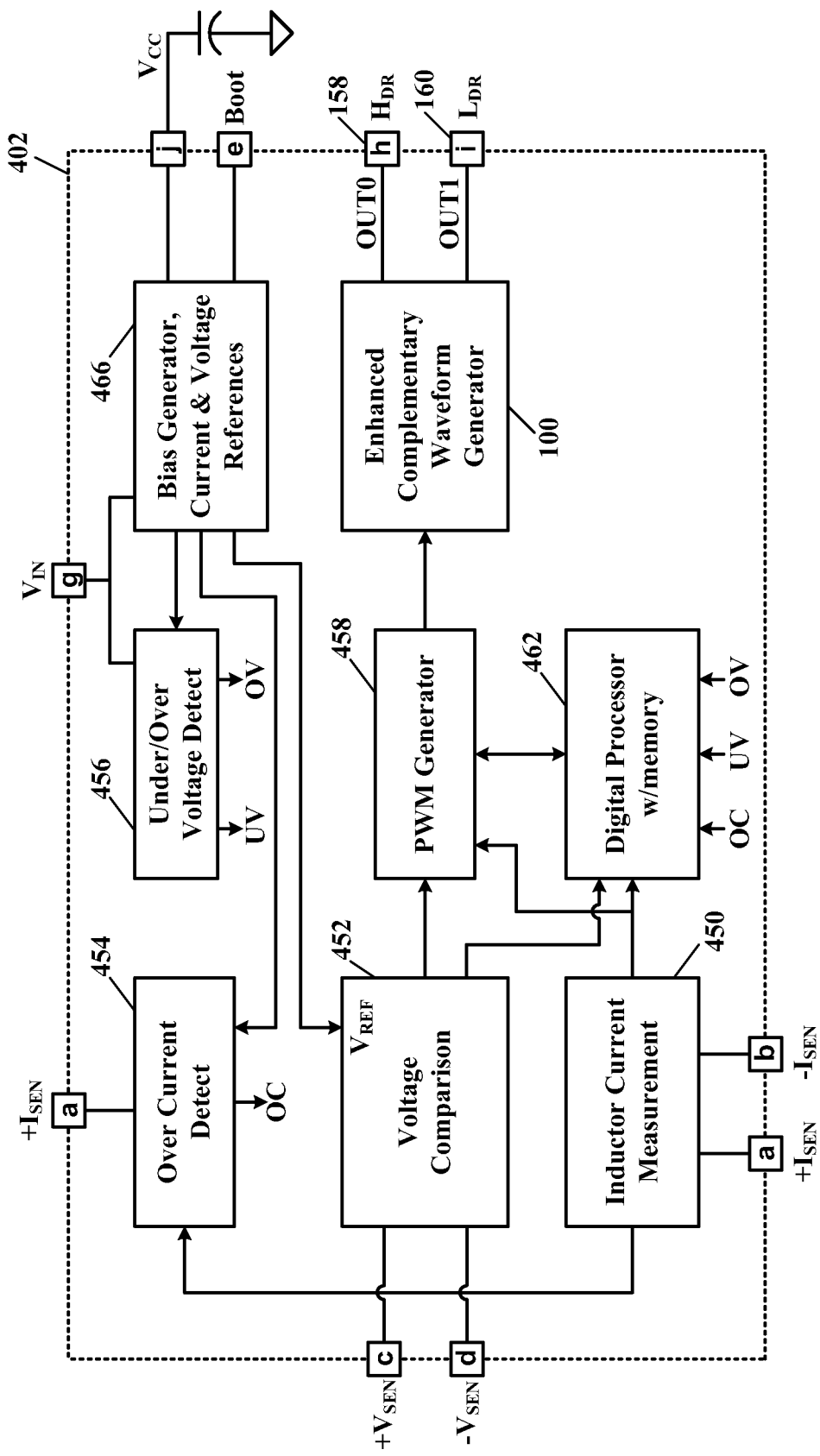
FIG. 4 illustrates a schematic block diagram of a typical integrated circuit for controlling a switch mode power supply (SMPS), according to the teachings of this disclosure.
Figure 5:
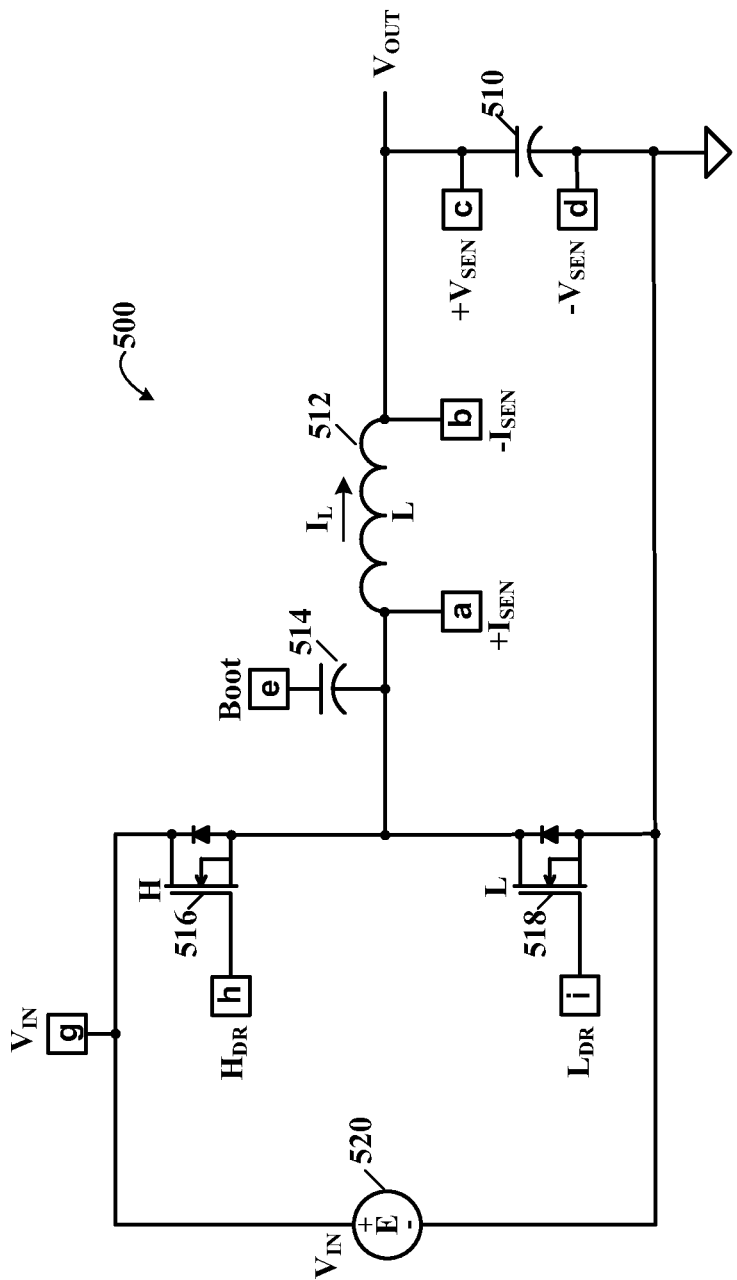
FIG. 5 illustrates a schematic diagram of power components used in a typical SMPS.

Referring to FIG. 4, depicted is a schematic block diagram of a typical integrated circuit for controlling a switch mode power supply (SMPS), according to the teachings of this disclosure. The ECWG 100 may be included in an integrated circuit SMPS controller 402 that also comprises a pulse width modulation (PWM) generator 458, a digital processor with memory 462 (e.g., microcontroller), an inductor current measurement circuit 450, a voltage comparison circuit 452, an over current detection circuit 454, an under/over voltage detection circuit 456, and bias generator, current and voltage references 466. The SMPS controller 402 is used to drive power components of a SMPS 500 (FIG. 5). A single output from the PWM generator 458 is used in this example and serves as both the rising event and the falling event inputs to the ECWG 100 shown in FIG. 1.

Referring to FIG. 5, depicted is a schematic diagram of power components used in a typical SMPS. The power components of the SMPS 500 is fed from a voltage source 520 and may comprise a high power transistor 516, a low power transistor 518, a power inductor 512, a filter capacitor 510, and a boot coupling capacitor 514, all coupled to the SMPS controller 402 as shown in FIGS. 4 and 5.

While embodiments of this disclosure have been depicted, described, and are defined by reference to example embodiments of the disclosure, such references do not imply a limitation on the disclosure, and no such limitation is to be inferred. The subject matter disclosed is capable of considerable modification, alteration, and equivalents in form and function, as will occur to those ordinarily skilled in the pertinent art and having the benefit of this disclosure. The depicted and described embodiments of this disclosure are examples only, and are not exhaustive of the scope of the disclosure.

What is claimed is:

1. An apparatus for generating complementary waveforms, comprising:
   a clock input coupled to a clock source;
   a rising event input coupled to a rising event source;
   a rising event blanking circuit having an input coupled to the rising event source, wherein the rising event blanking circuit is used to blank out subsequent rising event signals rising within a programmable rising event blanking time period;
   rising event combinatorial logic having a first input coupled to the rising event source and a second input coupled to an output of the rising event blanking circuit, wherein when the first and second inputs are at a first logic level an output thereof is at the first logic level;
   a rising event level detector having an input coupled to an output of the rising event combinatorial logic, wherein the rising event level detector detects a rising change in a voltage level of the output from the rising event combinatorial logic;
   a rising event phase delay circuit having an input coupled to the output from the rising event level detector, wherein the rising event phase delay circuit has a output that has a programmable delay from its input;
   a rising event multiplexer having a first input coupled to the output of the rising event combinatorial logic and a second input coupled to an output of the rising event phase delay circuit, wherein when the first input is selected the rising event source is detected on a rising edge thereof and when the second input is selected the rising event source is detected on a rising voltage level thereof;
   a falling event input coupled to a falling event source;
   a falling event blanking circuit having an input coupled to the falling event source, wherein the falling event blanking circuit is used to blank out subsequent falling event signals falling within a programmable falling event blanking time period;
   falling event combinatorial logic having a first input coupled to the falling event source and a second input coupled to an output of the falling event blanking circuit, wherein when the first and second inputs are at a first logic level an output thereof is at the first logic level;
   a falling event level detector having an input coupled to an output of the falling event combinatorial logic, wherein the falling event level detector detects a falling change in a voltage level of the output from the falling event combinatorial logic;
   a falling event multiplexer having a first input coupled to the output of the falling event combinatorial logic and a second input coupled to an output of the falling event level detector, wherein when the first input is selected the falling event source is detected on a falling edge thereof and when the second input is selected the falling event source is detected on a falling voltage level thereof;
   a reset-set (RS) flip-flop having a set input coupled to an output of the rising event multiplexer and reset input coupled to an output of the falling event multiplexer, wherein when the set input goes to the first logic level a Q output of the RS flip-flop goes to the first logic level and when the reset input goes to the first logic level a Q-not output of the RS flip-flop goes to the first logic level and the Q output goes to a second logic level;
   first output combinatorial logic having a first input coupled to the Q output of the RS flip-flop;
   a first programmable deadband time circuit having an output coupled to a second input of the first output combinatorial logic and a reset input coupled to the Q output of the RS flip-flop, wherein when the reset input is at the first logic level the output goes to the first logic level after a first programmable deadband time, whereby the output of the first output combinatorial logic goes to the first logic level;
   second output combinatorial logic having a first input coupled to the Q-not output of the RS flip-flop; and
   a second programmable deadband time circuit having an output coupled to a second input of the second output combinatorial logic and a reset input coupled to the Q-not output of the RS flip-flop, wherein when the reset input is at the first logic level the output goes to the first logic level after a second programmable deadband time, whereby the output of the second output combinatorial logic goes to the first logic level.

2. The apparatus according to claim 1, further comprising a clock multiplexer coupled between the clock input and a plurality of clock sources.

3. The apparatus according to claim 1, further comprising a rising event multiplexer coupled between the rising event input and a plurality of rising event sources.

4. The apparatus according to claim 1, further comprising a falling event multiplexer coupled between the falling event input and a plurality of falling event sources.

5. The apparatus according to claim 1, further comprising output polarity reversing circuits in the first output combinatorial logic and the second output combinatorial logic.

6. The apparatus according to claim 5, further comprising:
   a first output multiplexer having a first input coupled to an output of the first output combinatorial logic and a second input coupled to a first programmable logic level; and
   a second output multiplexer having a first input coupled to an output of the second output combinatorial logic and a second input coupled to a second programmable logic level;
   wherein when an auto-shutdown occurs outputs of the first and second multiplexers are forced to the first and second logic levels, respectively.

7. The apparatus according to claim 6, further comprising first and second disconnect switches coupled to the first and second outputs of the first and second output multiplexers, respectively, for disconnecting the first and second outputs from first and second inputs of power circuits.

8. The apparatus according to claim 1, wherein the apparatus for generating complementary waveforms is included in an integrated circuit that also comprises a pulse width modulation (PWM) generator having an output coupled to the rising and falling event inputs.

9. The apparatus according to claim 6, wherein the auto-shutdown has at least one auto-shutdown input.

10. The apparatus according to claim 1, wherein outputs of the first and second output combinational logics are never at the first logic level at the same time.

11. The apparatus according to claim 1, wherein outputs of the first and second output combinational logics are at the second logic levels during either the first and/or second programmable deadband times.

12. The apparatus according to claim 1, wherein the rising and falling event blanking circuits, the rising event phase delay circuit, and the first and second programmable deadband time circuits are coupled to the clock input and derive incremental time values therefrom.

13. The apparatus according to claim 1, further comprising:
rising and falling blanking time registers for storing the rising and falling event blanking time periods;
a rising event phase delay register for storing a rising event phase delay time; and
rising and falling deadband time registers for storing rising and falling event deadband time values.

14. A method for generating complementary waveforms, said method comprising the steps of:
providing a rising event source;
providing for blanking of subsequent rising events within a programmable rising event blanking time period;
selecting between detection of a rising event source edge or a rising event source voltage level for generating a rising event signal;
providing a falling event source;
providing for blanking of subsequent falling events within a programmable falling event blanking time period;
selecting between detection of a falling event source edge or a falling event source voltage level for generating a falling event signal;
asserting a first output upon detection of the rising event until detection of the falling event; and
asserting a second output upon detection of the falling event until detection of a next rising event.

15. The method according to claim 14, further comprising the step of providing for a rising event phase delay, wherein the rising event phase delay delays the rising event signal.

16. The method according to claim 14, further comprising the step of providing a deadband time between the steps of asserting the first output and asserting the second output.

17. The method according to claim 16, wherein the step of providing the deadband time comprises the step of delaying assertion of the first output after the step of de-asserting the second output.

18. The method according to claim 16, wherein the step of providing the deadband time comprises the step of delaying assertion of the second output after the step of de-asserting the first output.

19. The method according to claim 14, further comprising the step of forcing the first and second outputs to predefined logic levels upon assertion of an auto-shutdown.

20. The method according to claim 14, further comprising the steps of:
selecting the rising event source from a plurality of rising event sources; and
selecting the falling event source from a plurality of falling event sources.

21. The method according to claim 14, further comprising the steps of enabling and disabling the first and second outputs.

22. The method according to claim 14, further comprising the steps of:
storing rising and falling event blanking time period values in rising and falling blanking time period registers;
storing rising event phase delay in a rising event phase delay register; and
storing rising and falling event deadband time period values in rising and falling deadband time period registers.

* * * * *